(12) United States Patent
Yang et al.

(10) Patent No.: US 7,906,895 B2
(45) Date of Patent: Mar. 15, 2011

(54) ORGANIC ELECTROLUMINESCENT DISPLAY DEVICE USING ELECTRODE SURFACE REFORMING LAYER

(75) Inventors: Nam-Choul Yang, Seoul (KR); Seong-Taek Lee, Suwon-si (KR); Min-Chul Suh, Seongnam-si (KR); Mu-Hyun Kim, Suwon-si (KR); Byung-Doo Chin, Seongnam-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 733 days.

(21) Appl. No.: 10/912,062

(22) Filed: Aug. 6, 2004

(65) Prior Publication Data

US 2005/0029932 A1  Feb. 10, 2005

(30) Foreign Application Priority Data

Aug. 8, 2003  (KR) ........................ 10-2003-0055127

(51) Int. Cl.
*H01J 1/62* (2006.01)
(52) U.S. Cl. .................. 313/504; 313/503; 313/506
(58) Field of Classification Search ........... 313/498–512
See application file for complete search history.

(56) References Cited

U.S. PATENT DOCUMENTS

| | | | | |
|---|---|---|---|---|
| 5,281,489 A | * | 1/1994 | Mori et al. | 428/690 |
| 5,449,584 A | * | 9/1995 | Banba et al. | 430/190 |
| 5,932,362 A | * | 8/1999 | Nagai et al. | 428/690 |
| 6,127,004 A | | 10/2000 | Hatwar | |
| 6,208,075 B1 | | 3/2001 | Hung | |
| 6,208,077 B1 | | 3/2001 | Hung | |
| 2002/0109458 A1 | * | 8/2002 | Pichler et al. | 313/504 |
| 2003/0057827 A1 | * | 3/2003 | Kido et al. | 313/504 |
| 2003/0098646 A1 | * | 5/2003 | Suh et al. | 313/504 |

FOREIGN PATENT DOCUMENTS

| | | |
|---|---|---|
| CN | 1423512 | 6/2003 |
| JP | 08-288069 | 11/1996 |

(Continued)

OTHER PUBLICATIONS

Soo-Jin Chua, et al.; Stabilization of electrode migration in polymer electroluminescent devices; Applied Physics Letters, vol. 81, No. 6; Aug. 5, 2002; pp. 1119-1121.

(Continued)

*Primary Examiner* — Bumsuk Won
(74) *Attorney, Agent, or Firm* — H.C. Park & Associates, PLC (57) ABSTRACT

An organic electroluminescent display (OLED) device having an anode electrode covered with a solution-coated ultra-thin polymer film (reforming layer) is disclosed. In one embodiment, an OLED device includes a substrate having a first anode electrode formed thereon. The first anode electrode is covered with an ultra-thin polymer film (reforming layer). An organic emission layer is formed over an upper surface of the reforming layer, and a second cathode electrode is formed over the organic emission layer. The reforming layer is made of a material selected from a general polymer that is a soluble polymer, a heat resistant polymer, and a fluorine-based polymer having one or more functional groups. The solution coating methods which may be used to apply the reforming layer include a spin coating method, a doctor blade method, a dip coating method, a roll coating method, a spray coating method, and an ink jet method.

15 Claims, 5 Drawing Sheets

FOREIGN PATENT DOCUMENTS

| | | |
|---|---|---|
| JP | 11-224781 | 8/1999 |
| JP | 2000-150171 | 5/2000 |
| JP | 2001-023778 | 1/2001 |
| KR | 10-20030051344 A | 6/2003 |

OTHER PUBLICATIONS

Yong Qiu, et al.; Efficient light emitting diodes with Teflon buffer layer; Synthetic Metals 130 (2002); pp. 235-237.

Nam Chul Yang, et al., "Ultra-thin fluoropolymer buffer layer as an anode stabilizer of organic light emitting devices", J. Phys. D: Appl. Phys. 40 (2007) 4466-4470.

R. Wagner, et al., "Silicon-Modified Carbohydrate Surfactants V: The Wetting Behaviour of Low-Molecular-Weight Siloxane, Carbosilane, Silane and Polysilane Precursors on Low Energy Surfaces", Applied Organometallic Chemistry, vol. 11, 645-657 (1997).

* cited by examiner

ORGANIC ELECTROLUMINESCENT DISPLAY DEVICE USING ELECTRODE SURFACE REFORMING LAYER

CROSS-REFERENCE TO RELATED APPLICATION

This application claims priority of Korean Patent Application No. 2003-55127, filed Aug. 8, 2003, which is hereby incorporated by reference.

BACKGROUND OF THE INVENTION

1. Field of the Invention

The present invention relates to organic electroluminescent display devices generally, and more particularly to an organic electroluminescent display device having an anode covered with a surface reforming layer made of a polymer.

2. Description of the Prior Art

Organic electroluminescent display (OLED) devices have begun replacing cathode ray tube display (CRTD) and liquid crystal display (LCD) devices, because OLEDs typically offer a thinner profile, wider viewing angle, lighter weight, faster response time, and lower power consumption, than CRTDs and LCDs. Another advantage over CRTDs and LCDs is that the relatively simple structure of an OLED, typically an anode, a cathode, and an organic (thin film) emission layer positioned therebetween, permits OLEDs to be easily fabricated using relatively inexpensive manufacturing processes.

The organic emission layer may include several layers depending on its functions. A typical organic emission layer includes a hole injection layer, a hole transporting layer, an emitting layer, an electron transporting layer, and an electron injection layer. The conventional anode electrode is made of a transparent conductive material, such as indium-tin oxide (ITO), having superior transparency and conductivity and a high work function. However, an anode electrode formed of pure ITO generally has an unstable chemical structure. This unstable chemical structure may cause impurities such as oxygen, indium, etc., to be diffused into the organic emission layer, which is typically formed on the anode electrode. This permeation of impurities greatly impairs operability and reduces the lifetime of the OLED.

Another disadvantage of using a conventional, and chemically unstable, anode electrode is that its hydrophilic properties are strong. Consequently, it is difficult to remove accumulated moisture from the interior of the OLED. Additionally, conventional anode electrodes typically have poor interface properties because their surface energy differs from that of the organic emission layer.

One of the methods for improving the properties and lifetime of an organic electroluminescent display device is to reform its anode electrode by covering the anode electrode with what is called a reforming layer, typically a polymer. Exemplary types of conventional polymer layers and conventional methods for forming them are more fully described in U.S. Pat. Nos. 6,127,004, 6,208,075, and 6,208,077. To enhance the hole injection and to improve the operating stability of an organic electroluminescent display device, a conventional reforming layer, e.g. an amorphous CFx polymer layer substantially formed of carbon and fluorine or a Teflon-like polymer, is plasma-polymerized by introducing CFx or CHyFx gas between the hole injection layer and the transparent conductive anode electrode, typically formed of ITO. Additionally, Y. Qiu, Y. Gao, L. Wang, D. Zhang et al. have reported that a fluorine-based polymer formed of CFx or CHyFx can be formed as a reforming layer using a chemical vapor deposition (CVD) method (see Synth. Met. 2002, 130, 235-237). Similarly, S. Chua, L. Ke, R. S. Kumar, K. Zhang et al. have reported that poly(p-xylylene) can be formed as a reforming layer using a chemical vapor deposition (CVD) method (Appl. Phys. Lett. 2002, 81, 1119-1121).

These methods, however, require high-cost vapor deposition equipment or vacuum equipment. Moreover, a polymer layer formed by a polymerization process, such as vapor deposition or plasma-polymerization, becomes physically and chemically unstable over time. Moreover, using such methods makes it difficult to chemically define the reforming layer and the storage life of the OLED is decreased because the physical and chemical stability of the reformed anode electrode becomes poor.

SUMMARY OF THE INVENTION

An organic electroluminescent display (OLED) device having an anode electrode covered with a solution-coated ultra-thin polymer film (reforming layer) is disclosed. In one embodiment, the OLED device includes a substrate having a first anode electrode formed thereon. The first anode electrode is covered with an ultra-thin polymer film (reforming layer). An organic emission layer is formed over an upper surface of the reforming layer, and a second cathode electrode is formed over the organic emission layer. The reforming layer is made of a material selected from a general polymer that is a soluble polymer, a heat resistant polymer, and a fluorine-based polymer having one or more functional groups. The solution coating methods which may be used to apply the reforming layer include a spin coating method, a doctor blade method, a dip coating method, a roll coating method, a spray coating method, and an ink jet method.

BRIEF DESCRIPTION OF THE DRAWINGS

In the drawings, the thickness of layers and regions are exaggerated for clarity.

DETAILED DESCRIPTION OF THE PREFERRED EMBODIMENTS

The pre-treatment, solution coating, and post-treatment methods and processes described herein are not described in detail in order not to unnecessarily obscure embodiments of the present invention. Such fabrication methods and processes should be easily understood by persons skilled in the OLED manufacturing, and related, arts.

Figure 1:
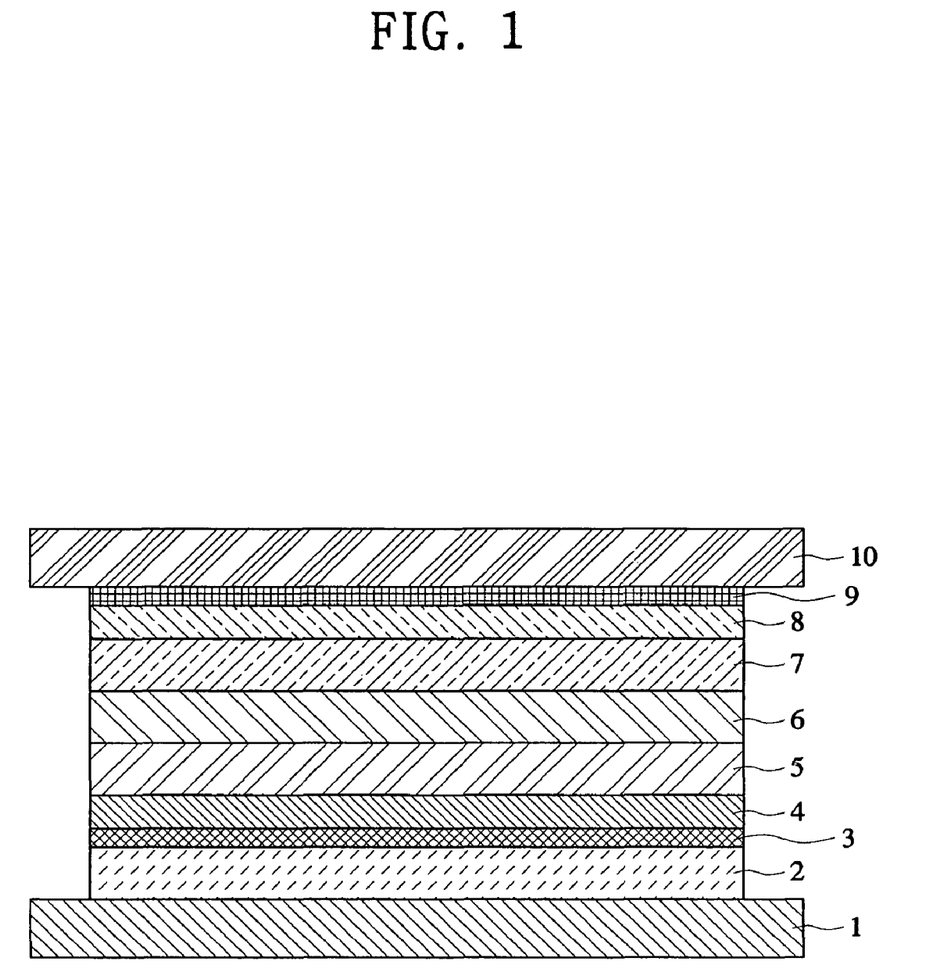
FIG. 1 is a cross-sectional view illustrating an OLED device configured in accordance with an embodiment of the present invention.

FIG. 1 is a cross-sectional view illustrating an OLED device fabricated in accordance with an embodiment of the present invention. In this embodiment, a first electrode 2 is formed on a substrate 1 made of glass or silicon. If configured as an anode electrode, the first electrode 2 is formed of a transparent conductive material selected from Indium Tin Oxide (ITO), Indium Zinc Oxide (IZO), and Indium Cerium Oxide (ICO).

Prior to reforming, the first electrode 2 is subjected to a solvent cleaning process, an ultrasonic cleaning process, a heat treatment process, a plasma treatment using hydrogen, oxygen, ozone, etc., a UV-ozone treatment, and/or a silane treatment before other subsequent processes are performed. Cleaning processes such as these facilitate electron injection into an ionization energy level of an upper organic film by cleaning organic impurities from the electrode (hereinafter, anode electrode) and by lowering an electronic energy level of the anode electrode. Such cleaning processes also improve the interface properties between the anode electrode and a subsequently formed reforming layer formed on the anode electrode, and do so by increasing the anode electrode's interfacing energy and by enhancing the coating properties of the reforming layer.

After first anode electrode 2 is formed, a reforming layer 3 is formed over the entire upper surface of the first anode electrode 2. The reforming layer 3 is made of a polymer, and is formed of one kind of polymer selected from a general soluble polymer, a heat resistance polymer, and a fluorine-based polymer having one or more functional groups.

As the general soluble polymer, poly(acrylics) or poly(methacrylics) and its derivatives, poly(acrylates) or poly(methacrylates) and its derivatives, poly(acrylamides) or poly(methacrylamides) and its derivatives, unsubstituted or substituted polydienes, poly(vinyl ethers) and its derivatives, poly(acetals) and its derivatives, poly(vinyl ketones) and its derivatives, poly(vinyl nitriles) and its derivatives, poly(vinyl esters) and its derivatives, poly(styrenes) and its derivatives, aliphatic, aromatic and aliphatic-aromatic poly(oxides), poly(carbonates) derivative, aliphatic, aromatic and aliphatic-aromatic poly(esters), poly(urethanes) derivative, poly(aryl sulfonates) derivative, poly(siloxanes) derivative, aliphatic, aromatic and aliphatic-aromatic poly(amides), and its derivatives, may be used.

As the heat resistant polymer, unsubstituted or substituted aliphatic, aromatic and aliphatic-aromatic poly(imides) and its derivatives, unsubstituted or substituted aliphatic, aromatic and aliphatic-aromatic poly(benzoxazoles) and its derivatives, unsubstituted or substituted aliphatic, aromatic and aliphatic-aromatic poly(dibenzoxazoles) and its derivatives, unsubstituted or substituted aliphatic, aromatic and aliphatic-aromatic poly(benzothiazoles) and its derivatives, unsubstituted or substituted aliphatic, aromatic and aliphatic-aromatic poly(dibenzothiazoles) and its derivatives, unsubstituted or substituted aliphatic, aromatic and aliphatic-aromatic poly(benzimidazoles) and its derivatives, and unsubstituted or substituted aliphatic, aromatic and aliphatic-aromatic poly(dibenzimidazoles) and its derivatives, are used. In addition, as the fluorine-based polymer having one or more functional groups, a fully fluorine-substituted or partially fluorine-substituted fluorine-based polymer which includes at least one or more functional group selected from a group consisting of a ketone group, a carboxyl group, an ester group, an ether group, an amide group, amine group, a silane group, a sulfone group and an aromatic group in its main-chain or side-chain may be used.

In one embodiment, the reforming layer 3 is formed to a thickness equal to or in the range of approximately 0.3 nm to approximately 15 nm. Forming a reforming layer much less than 0.3 nm thick is challenging because limitations on currently available technology render it difficult to continuously form such a thin layer. In most cases it is undesirable to form a reforming layer much more than 15 nm thick, because an unsuitably thick reforming layer can generate an undesirably large energy barrier and increase isolation properties, which renders hole injection very difficult or impossible. However, it should be understood that the claimed invention is not to be so limited, but rather includes a reforming layer of any suitable thickness that works. In practice, a reforming layer in the range of approximately 0.5 nm to approximately 10 nm works well.

In one embodiment, the reforming layer 3 is formed using a solution coating method selected from a spin coating method, a doctor blade method, a dip coating method, a roll coating method, a spray coating method, and an ink jet method. As such solution coating methods are relatively inexpensive, using them to reform an OLED anode electrode can reduce manufacturing costs as compared with conventional high-cost vapor deposition processes and vacuum processes.

Once the reforming layer 3 is formed, it may be subjected to post-treatments including an optical energy treatment, such as heat, ultraviolet, etc., a plasma treatment, a solvent cleaning process, and the like. Such post-treatments can be performed using vacuum, atmospheric pressure, or pressurization conditions, depending on the nature of the type of post-treatment(s) performed.

After the first electrode reforming layer 3 has been formed, and optionally post-treated as described above, an organic emission layer 6 is formed on the reforming layer by patterning. The organic emission layer 6 is made of an organic material selected from an organic polymer or non-polymer material, and the like.

The organic emission layer is formed using a method selected from a spin coating method, a vacuum vapor deposition method, a laser-induced thermal imaging method, and the like.

In one embodiment, a hole injection layer 4 and/or a hole transporting layer 5 is formed between the first electrode reforming layer 3 and the organic emission layer 6. The hole injection layer is formed of a material selected from copper phthalocyanine (CuPc) or 4,4',4''-tris(N-(3-methylphenyl)-N-phenylamino)triphenylamine(MTDATA). The hole transporting layer 5, is formed of N,N'-di(1-naphthyl)-N,N'-diphenylbenzidine (NPD), or like materials are used.

After the organic emission layer 6 is formed, a second electrode 10 is deposited thereon. If the first electrode 2 is a transparent electrode, the second electrode 10 is made of a metal or metal alloy. Illustrative metals and metal alloys include, but are not limited to, Al, Ag, Yt, Ca, Mg/Ag, and like metals and metal alloys.

As shown in FIG. 1, the organic emission layer may further include a hole blocking layer 7, an electron transporting layer 8, and an electron injection layer 9 positioned between the emitting layer 6 and the second electrode 10.

The electron transporting layer 8 is not limited to a specific material. But illustrative and suitable materials include a polycyclic hydrocarbon-based derivative, a heterocyclic compound, an aluminum complex, a gallium complex and a derivative thereof, and the like.

Hereinafter, there are described examples of and OLED configured in accordance with several embodiments of the present invention. It is understood that the invention as claimed is not limited to the specific examples which follow, but that these examples serve merely to illustrate and explain embodiments of the present invention more fully.

First Exemplary Embodiment (Example 1)

A fluorine-based polymer FC-722 (available from 3M) was formed on an ITO transparent electrode using a spin coating method, and its thickness was 2 nm. Then, a hole injection layer, the 4,4',4''-tris(N-(3-methylphenyl)-N-phenylamino) tripheylamine (MTDATA) was deposited under conditions of $10^{-6}$ Torr vacuum to 100 nm thickness. Subsequently, N,N'-di(1-naphthyl)-N,N'-diphenylbenzidine (NPD) was deposited as a hole transporting layer under conditions of $10^{-6}$ Torr vacuum to 50 nm thickness. After depositing the NPD, IDE120 (available from Idemitsu Kosan Co. Ltd.) doped with 1% concentration of IDE105, a blue fluorescent material, was deposited as an emission layer under conditions of $10^{-6}$ Torr vacuum and 30 nm thickness. After depositing the emission layer, biphenoxy-bi(8-quinolinolato)aluminium (BAlq) was deposited, as a hole blocking layer, to 5 nm in thickness. Then, as an electron transporting layer, tris(8-quinolinolato)aluminium(Alq) was deposited under conditions of $10^{-6}$ Torr vacuum and to 20 nm thickness. After depositing the electron transporting layer, as an electron injection layer, LiF was deposited under conditions of $10^{-7}$ Torr vacuum to 1 nm thickness. Finally, to form a metal electrode, Al was deposited on the electron injection layer under conditions of $10^{-7}$ Torr vacuum to 300 nm thickness, and then hermetically sealed using a glass sealing substrate and a calcium oxide.

First Comparative Exemplary Embodiment (Comparative Example 1)

As the hole injection layer, 4,4',4''-tris(N-(3-methylphenyl)-N-phenylamino) triphenylamine (MTDATA) was deposited on an ITO transparent electrode under conditions of $10^{-6}$ Torr vacuum to 100 nm thickness. Then N,N'-di(1-naphthyl)-N,N'-diphenylbenzidine (NPD) was deposited, as the hole transporting layer, under conditions of $10^{-6}$ Torr vacuum to 50 nm thickness. After depositing the NPD, IDE120 (available from Idemitsu Kosan Co. Ltd.) doped with 1% concentration of IDE105, a blue fluorescent material, was deposited, as an emission layer, under conditions of $10^{-6}$ Torr vacuum to 30 nm thickness. After depositing the emission layer, biphenoxy-bi(8-quinolinolato)aluminium(BAlq) was deposited, as a hole blocking layer, to 5 nm in thickness. Then, as an electron transporting layer, tris(8-quinolinolato) aluminium(Alq) was deposited under conditions of $10^{-6}$ Torr vacuum to 20 nm thickness. After depositing the electron transporting layer, as an electron injection layer of LiF was deposited under conditions of $10^{-7}$ Torr vacuum to 1 nm thickness. Finally, to form a metal electrode, Al was deposited on the electron injection layer under conditions of $10^{-7}$ Torr vacuum to 300 nm thickness, and then hermetically sealed using a glass sealing substrate and a calcium oxide.

Second Exemplary Embodiment (Example 2)

A fluorine-based polymer FC-722 (available from 3M) was formed on a transparent substrate formed of ITO using a spin coating method, and the thickness of the coating thickness was 3 nm. Then BFE (available from Dow Chemical) was deposited, as a hole injection layer, to 500 nm in thickness using a spin coating method. Next, N,N'-di(1-naphthyl)-N, N'-diphenylbenzidine (NPD) was deposited, as a hole transporting layer, under conditions of $10^{-6}$ Torr vacuum to 50 nm thickness. After depositing the NPD, IDE120 (available from Idemitsu Kosan Co. Ltd.) doped with 1% concentration of IDE105, a blue fluorescent material, was deposited as an emission layer under conditions of $10^{-6}$ Torr vacuum to 30 nm thickness. After depositing the emission layer, biphenoxy-bi(8-quinolinolato)aluminium(BAlq) was deposited, as a hole blocking layer, to 5 nm in thickness. Then, as an electron transporting layer, tris(8-quinolinolato)aluminium (Alq) was deposited under conditions of $10^{-6}$ Torr vacuum to 20 nm thickness. After depositing the electron transporting layer, LiF was deposited, as an electron injection layer, under conditions of $10^{-7}$ Torr vacuum to 1 nm thickness. Finally, to form a metal electrode, Al was deposited on the electron injection layer under conditions of $10^{-7}$ Torr vacuum to 300 nm thickness, and then hermetically sealed using a glass sealing substrate and a calcium oxide.

Second Comparative Exemplary Embodiment (Comparative Example 2)

As a hole injection layer, the BFE (available from Dow Chemical) was deposited to 500 nm in thickness using a spin coating method. Then, as a hole transporting layer, N,N'-di (1-naphthyl)-N,N'-diphenylbenzidine (NPD) was deposited under conditions of $10^{-6}$ Torr vacuum to 50 nm thickness. After depositing the NPD, IDE120 (available from Idemitsu Kosan Co. Ltd.) doped with 1% concentration of IDE105, a blue fluorescent material, was deposited as an emission layer under conditions of $10^{-6}$ Torr vacuum to 30 nm thickness. After depositing the emission layer, biphenoxy-bi(8-quinolinolato)aluminium(BAlq) was deposited, as a hole blocking layer, to 5 nm in thickness. Then, as an electron transporting layer, tris(8-quinolinolato)aluminium(Alq) was deposited under conditions of $10^{-6}$ Torr vacuum to 20 nm thickness. After depositing the electron transporting layer, LiF was deposited, as an electron injection layer, under conditions of $10^{-7}$ Torr vacuum to 1 nm thickness. Finally, to form a metal electrode, Al was deposited on the electron injection layer under conditions of $10^{-7}$ Torr vacuum to 300 nm thickness, and then hermetically sealed using a glass sealing substrate and a calcium oxide.

Figure 2:
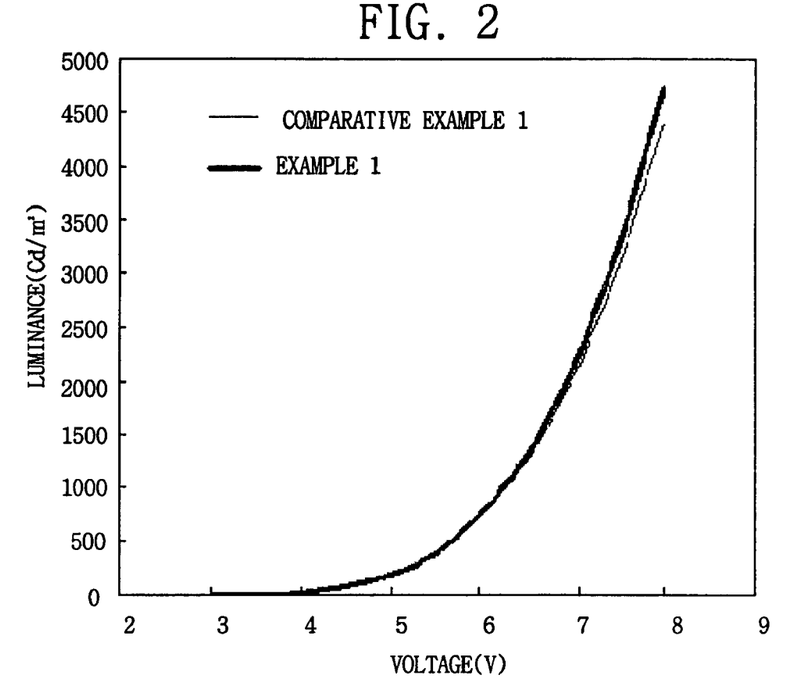
FIG. 2 is a graph showing voltage-luminance characteristics of an OLED device configured in accordance with a first exemplary embodiment (Example 1) as compared with an OLED device configured in accordance with a first comparative exemplary embodiment (Comparative Example 1) of the present invention.

FIG. 2 is a graph showing voltage-luminance characteristics of an OLED device configured in accordance with a first exemplary embodiment (hereinafter, Example 1) and a first comparative exemplary embodiment (hereinafter, Comparative Example 1) of the present invention. It will be appreciated that an OLED device configured in accordance with Example 1 has little difference in luminance at various specific operating voltages, as compared with an OLED device configured in accordance with Comparative Example 1.

Figure 3:
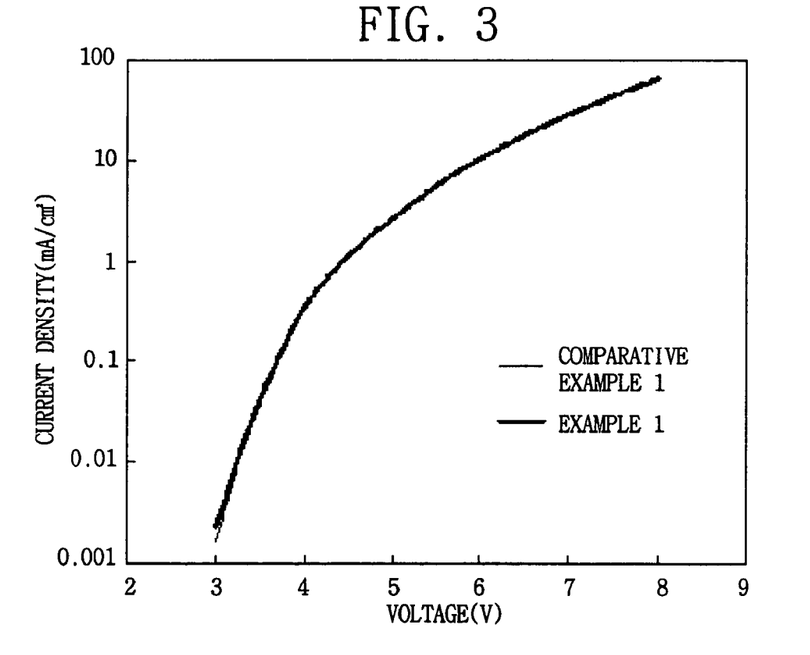
FIG. 3 is a graph showing voltage and current density relativity characteristics of an OLED device fabricated in accordance with Example 1 as compared with an OLED device configured in accordance with Comparative Example 1 of the present invention.

FIG. 3 is a graph showing voltage and current density relativity characteristics of an OLED device configured in accordance with Example 1 as compared to an OLED configured in accordance with Comparative Example 1 of the present invention. It will be appreciated that an OLED device configured in accordance with Example 1 has little difference in current density at various specific operating voltages, as compared with an OLED configured in accordance with Comparative Example 1.

Figure 4:
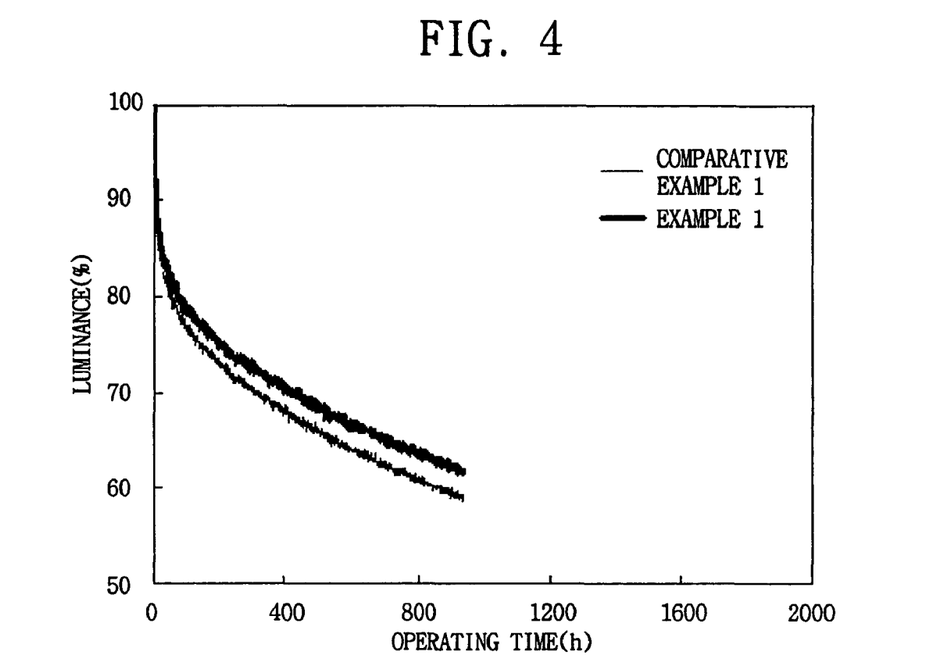
FIG. 4 is a graph showing changes in luminance of an OLED device fabricated in accordance with Example 1 as compared with an OLED device configured in accordance with Comparative Example 1 of the present invention, wherein the changes in luminance were measured at an initial luminance of 1,000 $Cd/m^2$ over time.
Figure 5:
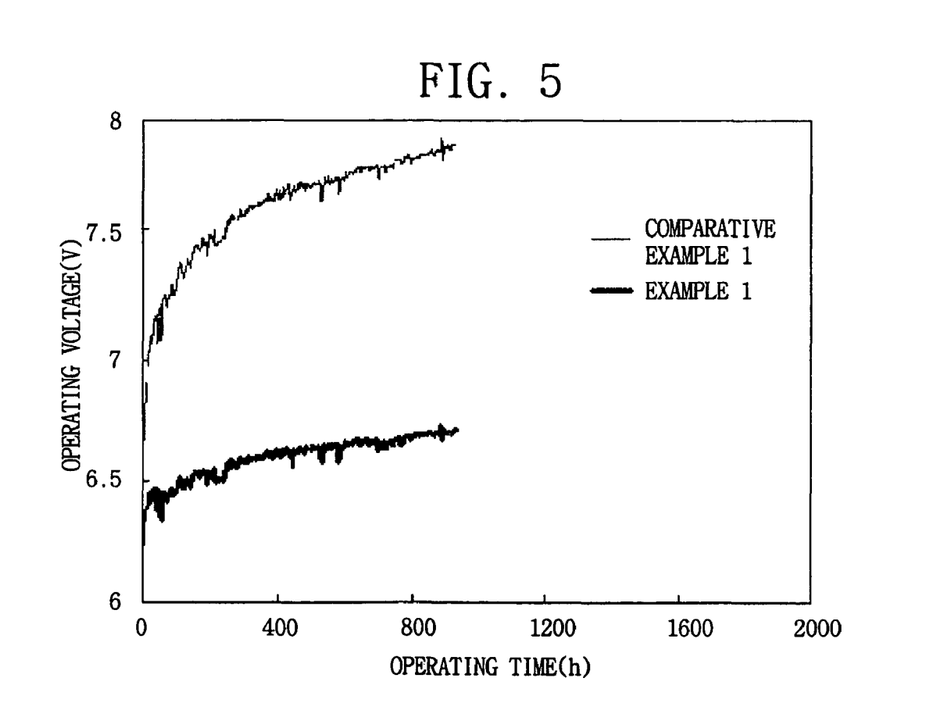
FIG. 5 is a graph showing changes in operating voltage of an OLED device fabricated in accordance with Example 1 as compared with an OLED device configured in accordance with Comparative Example 1 of the present invention, wherein the changes in operating voltage were measured at an initial luminance of 1,000 $Cd/m^2$ over time.

FIGS. 4 and 5 are graphs showing changes in luminance of an OLED device fabricated in accordance with Example 1 as compared to an OLED device configured in accordance with Comparative Example 1, wherein the changes in luminance were measured at an initial luminance of 1,000 $Cd/m^2$ over time.

Referring to FIG. 4, it will be appreciated that an OLED device configured in accordance with Example 1 has little reduction in luminance, as compared with an OLED device configured in accordance with Comparative Example 1. And referring to FIG. 5, it will also be appreciated that an OLED device configured in accordance with Example 1 has little change in operating voltage, as compared with an OLED device configured in accordance with Comparative Example 1.

Figure 6:
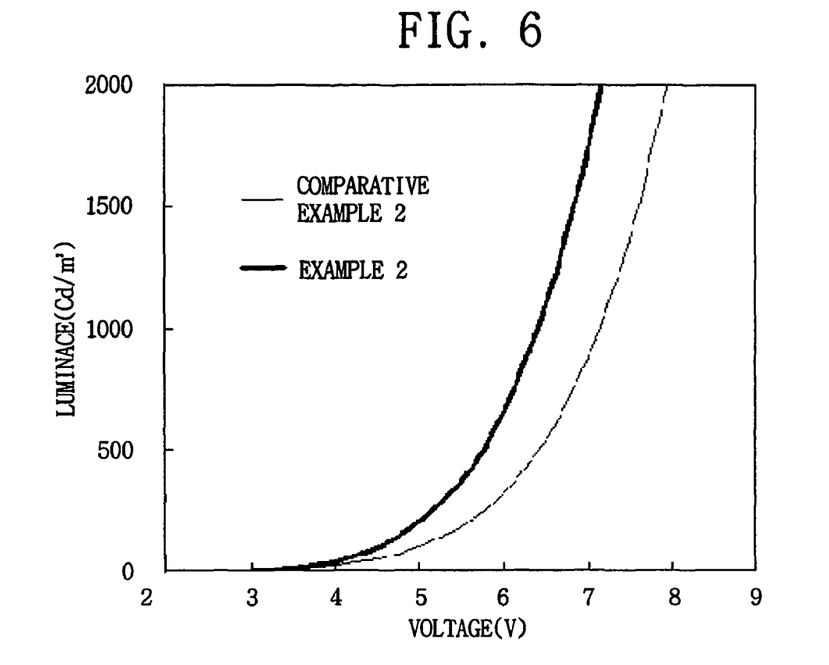
FIG. 6 is a graph showing voltage-luminance characteristics of an OLED device fabricated in accordance with a second exemplary embodiment (Example 2) as compared with an OLED device configured in accordance with a second comparative exemplary embodiment (Comparative Example 2) of the present invention.

FIG. 6 is a graph showing voltage-luminance characteristics of an OLED device fabricated in accordance with a second exemplary embodiment (hereinafter, Example 2) and a second comparative exemplary embodiment (Hereinafter, Comparative Example 2) of the present invention. It will be appreciated that an OLED device configured in accordance with Example 2 has a higher luminance value at a specific operating voltage, as compared an OLED device in accordance with Comparative Example 2.

Figure 7:
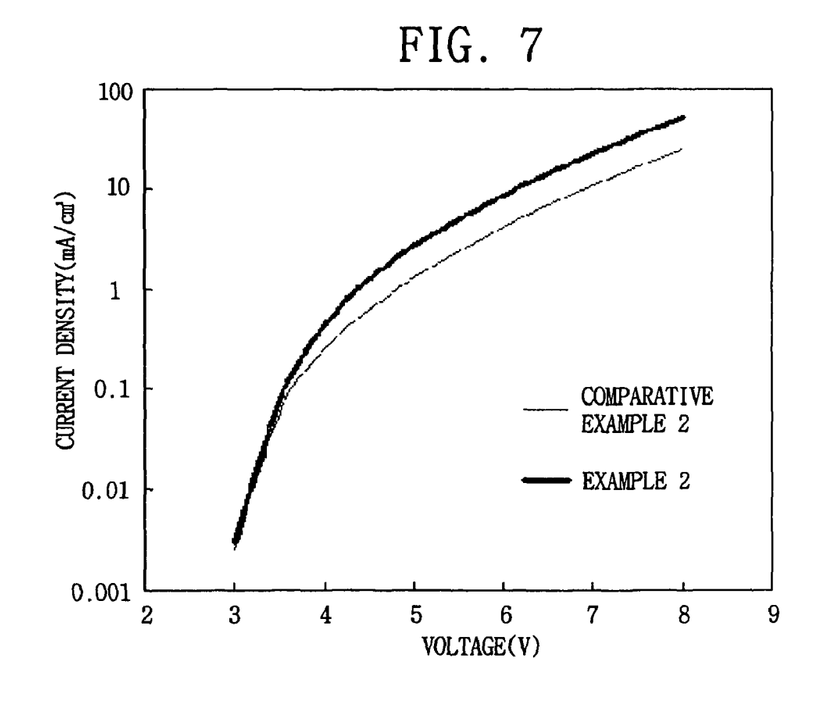
FIG. 7 is a graph showing voltage-current density characteristics of an OLED device fabricated in accordance with Second Example 2 as compared with an OLED device configured in accordance with Comparative Example 2 of the present invention.

FIG. 7 is a graph showing voltage-current density characteristics of an OLED device fabricated in accordance with Example 2 as compared to an OLED device configured in accordance Comparative Example 2. It will be appreciated that the OLED device configured in accordance with Example 2 has a higher current density at a specific operating voltage, as compared with the OLED device configured in accordance with Comparative Example 2.

Figure 8:
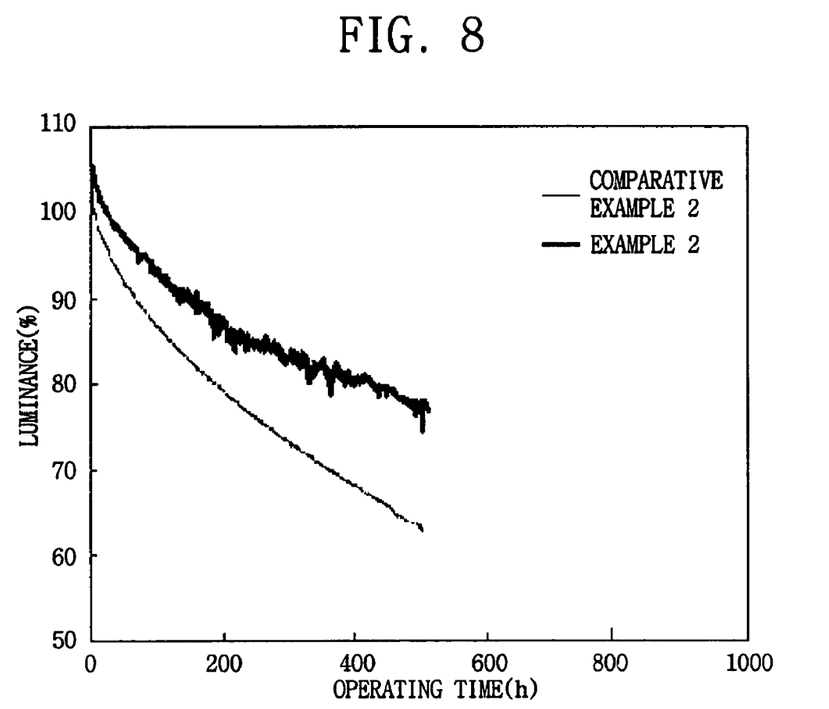
FIG. 8 is a graph showing changes in luminance of an OLED device fabricated in accordance with Example 2 as compared with an OLED device configured in accordance with Comparative Example 2 of the present invention, wherein the changes in luminance were measured at an initial luminance of 1,000 Cd/m$^2$ over time.
Figure 9:
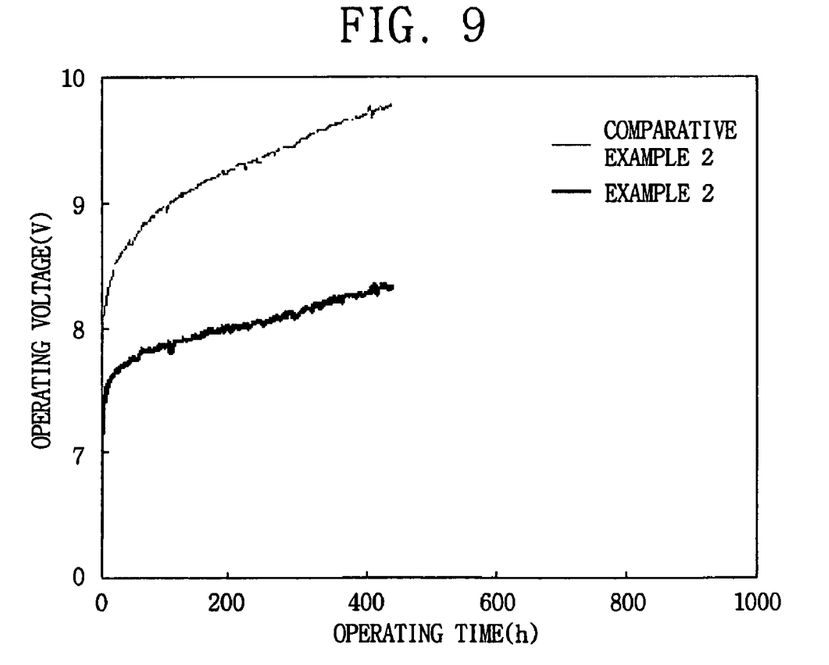
FIG. 9 is a graph showing changes in operating voltage of an OLED device fabricated in accordance with a Example 2 as compared with an OLED device configured in accordance with Comparative Example 2 of the present invention, wherein the changes in operating voltage were measured at an initial luminance of 1,000 Cd/m$^2$ over time.

FIGS. 8 and 9 are graphs showing changes in luminance of an OLED device configured in accordance with Example 2 as compared with an OLED device configured in accordance with Comparative Example 2, wherein the changes in luminance were measured at an initial luminance of 1,000 $Cd/m^2$ over time.

Referring to FIG. 8, it will be appreciated that the OLED device configured in accordance with Example 2 has little reduction in luminance, as compared with the OLED configured in accordance with Comparative Example 2. And referring to FIG. 9, it will also be appreciated that the OLED device configured in accordance with Example 2 has little changes in operating voltage, as compared with the OLED configured in accordance with Comparative Example 2.

Comparing the graphical test results of Example 1 and Example 2 it will be appreciated that the life and operating characteristics of an OLED device are improved by fabricating and utilizing embodiments of the reforming layer herein described.

It will be appreciated that embodiments of the present invention have no need for high-cost deposition equipment or vacuum equipment, but offer advantages in manufacturing a large-sized OLED device by using a solution coating method, such as spin coating, to form a ultra-thin polymer film (reforming layer) on an anode electrode. In turn, the chemically and physically stable ultra-thin polymer film increases the anode electrode's device's operational stability and process reliability.

Additionally, embodiments of the present invention can improve an OLED device's performance by using an ultra-thin polymer film to planarize an irregular surface of an anode electrode or other substrate structure. Coating an anode electrode with such a film can prevent the impurities such as oxygen, moisture, and so on, from being diffused or permeated into the organic emission layer, and can reduce the surface energy difference between the anode electrode and the organic emission layer, thereby increasing the interface adhesion force and extending the OLED device's life.

What is claimed is:

1. An organic electroluminescent display device, comprising:
    a substrate;
    a first electrode formed on the substrate;
    a reforming layer formed directly on the first electrode, the reforming layer being formed of a general soluble polymer or a fully fluorine-substituted or partially fluorine substituted fluorine-based polymer which includes at least one or more functional group selected from a group consisting of a ketone group, a carboxyl group, an ester group, an ether group, an amide group, an amine group, a silane group, a sulfone group and an aromatic group in its main-chain or side-chain;
    an organic emission layer formed over an upper surface of the reforming layer; and
    a second electrode formed over the organic emission layer,
    wherein the general soluble polymer is one kind of polymer selected from a group consisting of poly(acrylics) or poly(methacrylics) and its derivatives, poly(acrylates) or poly(methacrylates) and its derivatives, poly(acrylamides) or poly(methacrylamides) and its derivatives, unsubstituted or substituted polydienes, poly(vinyl ethers) and its derivatives, poly(acetals) and its derivatives, poly(vinyl ketones) and its derivatives, poly(vinyl nitriles) and its derivatives, poly(vinyl esters) and its derivatives, poly(styrenes) and its derivatives, aliphatic, aromatic and aliphatic-aromatic poly(oxides), poly(carbonates) derivative, aliphatic, aromatic and aliphatic-aromatic poly(esters), poly(urethanes) derivative, pol (aryl sulfonates) derivative, poly(siloxanes) derivative, aliphatic, aromatic and aliphatic-aromatic pol(amides) and its derivatives.

2. The organic electroluminescent display device of claim 1, wherein the first electrode is an anode electrode.

3. The organic electroluminescent display device of claim 1, wherein the reforming layer has a thickness in the range of 0.3 nm to 15 nm.

4. The organic electroluminescent display device of claim 3, wherein the thickness ranges from 0.5 nm to 10 nm.

5. The organic electroluminescent display device of claim 1, wherein the fluorine-based polymer having one or more functional groups is one of a fully fluorine-substituted fluorine-based polymer and a partially fluorine-substituted fluorine-based polymer which include at least one or more functional group selected from a group consisting of a ketone group, a carboxyl group, an ester group, an ether group, an amide group, an amine group, a silane group, a sulfone group, and an aromatic group in its main-chain or side-chain.

6. The organic electroluminescent display device of claim 1, wherein the polymer first electrode surface reforming layer is formed by one kind of solution coating method selected from a group consisting of a spin coating method, a doctor blade method, a dip coating method, a roll coating method, a spray coating method, and an ink jet method.

7. The organic electroluminescent display device of claim 1, wherein the first electrode is subjected to at least one coating pre-treatment process among pre-treatment processes consisting of a solvent cleaning process, an ultrasonic cleaning process, a heat treatment process, a hydrogen plasma treatment, an oxygen plasma treatment, an ozone plasma treatment, a UV-ozone treatment, and a silane treatment.

8. The organic electroluminescent display device of claim 1, wherein the polymer first electrode surface reforming layer is subjected to at least one coating post-treatment process among post-treatment processes consisting of a heat treatment, an optical treatment, a plasma treatment, and a solvent cleaning process.

9. The organic electroluminescent display device of claim 8, wherein the post-treatment process is performed under any one condition of vacuum, atmospheric pressure, and pressurization conditions.

10. The organic electroluminescent display device of claim 1, wherein the first electrode is formed of one kind of transparent conductive material selected from a group consisting of Indium Tin Oxide (ITO), Indium Zinc Oxide (IZO), and Indium Cerium Oxide (ICO).

11. An organic electroluminescent display device, comprising:
a substrate;
a first electrode formed on the substrate;
a reforming layer formed on the first electrode, the reforming layer formed of a heat resistant polymer;
an organic emission layer formed over an upper surface of the reforming layer; and
a second electrode formed over the organic emission layer,
wherein the heat resistant polymer is one kind of polymer selected from a group consisting of unsubstituted or substituted aliphatic, aromatic and aliphatic-aromatic poly(benzoxazoles) and its derivatives, unsubstituted or substituted aliphatic, aromatic and aliphatic-aromatic poly(dibenzoxazoles) and its derivatives, unsubstituted or substituted aliphatic, aromatic and aliphatic-aromatic poly(benzothiazoles) and its derivatives, unsubstituted or substituted aliphatic, aromatic and aliphatic-aromatic poly(dibenzothiazoles) and its derivatives, unsubstituted or substituted aliphatic, aromatic and aliphatic-aromatic poly(benzimidazoles) and its derivatives, and unsubstituted or substituted aliphatic, aromatic and aliphatic-aromatic poly(dibenzimidazoles) and its derivatives.

12. The organic electroluminescent display device of claim 11, wherein the first electrode is an anode electrode.

13. The organic electroluminescent display device of claim 11, wherein the reforming layer has a thickness in the range of 0.3 nm to 15 nm.

14. The organic electroluminescent display device of claim 13, wherein the thickness ranges from 0.5 nm to 10 nm.

15. The organic electroluminescent display device of claim 11, wherein the first electrode is formed of one kind of transparent conductive material selected from a group consisting of Indium Tin Oxide (ITO), Indium Zinc Oxide (IZO), and Indium Cerium Oxide (ICO).

* * * * *